United States Patent
Shih et al.

(10) Patent No.: US 8,165,188 B2
(45) Date of Patent: Apr. 24, 2012

(54) TRANSCEIVER WITH ADJUSTABLE SAMPLING VALUES AND SIGNAL TRANSCEIVING METHOD THEREOF

(75) Inventors: Chih-Yung Shih, Taipei (TW);
Liang-Wei Huang, Taipei (TW);
Shieh-Hsing Kuo, Taipei County (TW);
Chi-Shun Weng, Hsinchu County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 715 days.

(21) Appl. No.: 12/346,897

(22) Filed: Dec. 31, 2008

(65) Prior Publication Data
US 2009/0175322 A1  Jul. 9, 2009

(30) Foreign Application Priority Data
Jan. 4, 2008  (TW) ................. 97100297 A

(51) Int. Cl.
*H04L 5/16* (2006.01)
(52) U.S. Cl. ...................................................... 375/219
(58) Field of Classification Search .................. 375/219,
375/259, 316, 324; 370/286, 289; 379/3,
379/406.01–406.16, 387.02; 455/570; 324/607;
341/126, 127, 128, 155, 156, 159
See application file for complete search history.

(56) References Cited

U.S. PATENT DOCUMENTS

| | | | |
|---|---|---|---|
| 6,618,480 B1 | 9/2003 | Polley | |
| 2003/0138038 A1* | 7/2003 | Greiss et al. | 375/232 |
| 2004/0120391 A1* | 6/2004 | Lin et al. | 375/219 |
| 2007/0042721 A1 | 2/2007 | Gupta | |
| 2007/0047686 A1 | 3/2007 | Aoki | |

FOREIGN PATENT DOCUMENTS
EP  1 315 328 B1  1/2007
* cited by examiner

*Primary Examiner* — Sam K Ahn
(74) *Attorney, Agent, or Firm* — Winston Hsu; Scott Margo

(57) ABSTRACT

A transceiver includes: a first DAC, for receiving a first digital signal to generate an analog signal; an operation circuit, coupled to the first DAC, for receiving the analog signal and a feedback signal to generate an operated analog signal; an ADC, for generating a second digital signal according to the operated analog signal; a digital signal processing circuit, for processing the second digital signal to generate a processed digital signal; a second DAC, for generating the feedback signal according to the processed digital signal; an adjustable delay circuit, for delaying a clock signal according to a control signal to adjust at least one sampling point of at least one of the first DAC, the second DAC and the ADC; and a control circuit, for generating the control signal according to the processed digital signal.

12 Claims, 5 Drawing Sheets

TRANSCEIVER WITH ADJUSTABLE SAMPLING VALUES AND SIGNAL TRANSCEIVING METHOD THEREOF

BACKGROUND OF THE INVENTION

1. Field of the Invention

The present invention relates to a receiver and a method thereof, and particularly relates to a receiver that can adjust sampling points and a receiving method thereof.

2. Description of the Prior Art

Conventionally, a transceiver of an Ethernet includes a receiving terminal and a transmitting terminal that respectively receive or transmit signals via a channel. However, when the signals are transmitted or received, interference signals such as NEXT or ECHO will be generated due to different effects, for example, the received signal or transmitted signal interfering with each other. Therefore, a transceiver needs a mechanism to decrease the interference of signals.

Please refer to US Patent publication number 2007/0042721, which discloses a Tx DAC (transmitting terminal digital to analog converter), a hybrid circuit, a comparison circuit, a decoder/slicer, a Rx ADC (receiving terminal analog to digital converter), a digital processing circuit and a post processing circuit, which discloses a detailed operation of a prior art solution.

However, the conventional transceiver still has some disadvantages. For example, when the TX DAC receives a digital signal to generate an analog signal, the generated analog signal always includes an interference signal generated from the channel. In this case, the interference signals can be due to various factors such as the above-mentioned NEXT and ECHO. Accordingly, if the Rx ADC samples the transition part of the interference signal, the effect of the interference signals will increase, such that error sampling results may occur. Thus, a computed analog signal is generated via omitting part of the analog signal, such that the computed analog signal can fall within a scope that the Rx ADC can process. However, some error may occur when part of the signal is omitted such that the signal after omission cannot locate at a correct position. A new method for solving this problem is therefore required.

SUMMARY OF THE INVENTION

One objective of the present invention is to provide a transceiver, which can solve the aforementioned problems.

One objective of the present invention is to provide a transceiver, which includes a mechanism for providing delay signals for sampling or delaying to devices in the transceiver. Alternatively, the transceiver can provide multi phase clock signals for sampling to devices in the transceiver, such that a preferred sampling point or a preferred signal can be obtained.

One embodiment of the present invention discloses a transceiver, comprising: a first DAC, for receiving a first digital signal to generate an analog signal; an operation circuit, coupled to the first DAC, for receiving the analog signal and a feedback signal to generate an operated analog signal; an ADC, for generating a second digital signal according to the operated analog signal; a digital signal processing circuit, for processing the second digital signal to generate a processed digital signal; a second DAC, for generating the feedback signal according to the processed digital signal; an adjustable delay circuit, for delaying a clock signal according to a control signal to adjust at least one sampling point of at least one of the first DAC, the second DAC and the ADC; and a control circuit, for generating the control signal according to the processed digital signal.

Another embodiment of the present invention discloses a signal receiving/transmitting method, adapted to a transceiver, the method comprising: utilizing a first DAC to receive a first digital signal for generating an analog signal; generating an operated analog signal according to the analog signal and a feedback signal; generating a second digital signal according to the operated analog signal; generating a processed digital signal according to the second digital signal; utilizing a second DAC for generating the feedback signal according to the processed digital signal; generating the control signal according to the processed digital signal; and adjusting at least one sampling point of at least one of the first DAC and the second DAC.

Another embodiment of the present invention discloses a transceiver, which comprises: a first DAC, for receiving a first digital signal to generate an analog signal; an operation circuit, coupled to the first DAC, for receiving the analog signal and a feedback signal to generate an operated analog signal; an ADC, for sampling the operated analog signal to generate a second digital signal; a digital signal processing circuit, for processing the second digital signal to generate a processed digital signal; a second DAC, for generating the feedback signal according to the processed digital signal; a multi phase clock signal generator, for providing a plurality of clock signals with different phases to at least one of the ADC and the second DAC; and a determining circuit, for sampling the operated analog signal according to the clock signals to generate a plurality of sampling values, and for determining a sampling clock signal according to the sampling values.

Another embodiment of the present invention discloses a signal receiving/transmitting method, comprising: receiving a first digital signal and a feedback signal; generating an analog signal according to the first digital signal; generating an operated analog signal according to the analog signal and the feedback signal; utilizing an ADC for sampling the operated analog signal to generate a second digital signal; generating a processed digital signal according to the second digital signal; utilizing a DAC to generate the feedback signal according to the processed digital signal; providing a plurality of clock signals with different phases to at least one of the ADC and the DAC; and sampling the processed digital signal via the clock signals to generate a plurality of sampling values, and determining a target clock signal according to the sampling values.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
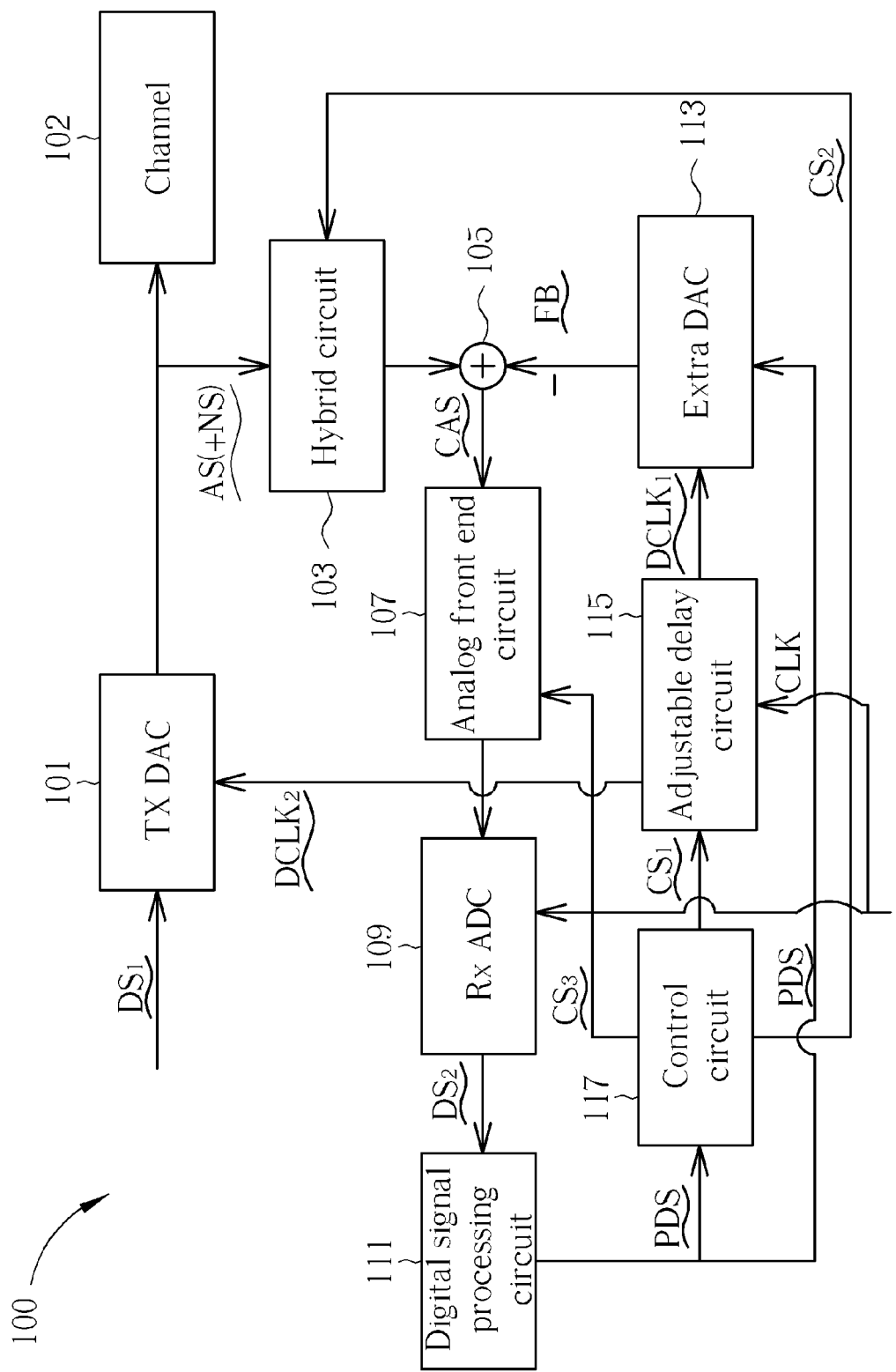
FIG. 1 is a functional block diagram of a transceiver according to a first embodiment of the present invention.

FIG. 1 is a functional block diagram of a transceiver 100 according to a first embodiment of the present invention. As shown in FIG. 1 the transceiver 100 includes a TX DAC 101, a hybrid circuit 103, a subtractor 105, an analog front end circuit 107, a Rx ADC 109, a digital signal processing circuit 111, an extra DAC 113, an adjustable delay circuit 115 and a control circuit 117. The TX DAC 101 receives a digital signal DS1 to generate an analog signal AS, which always includes an interference signal NS generated from the channel. The hybrid circuit 103 is an interference restraining circuit that is utilized for omitting the interference signal NS included in the analog signal AS. The subtractor 105 receives the analog signal AS and a feedback signal FB to generate an operated analog signal CAS. The analog front end circuit 107 can include a PGA (programmable gain amplifier), a low pass filter and an ADC, such that the analog front end circuit 107 can decrease interference and increase signal quality. The Rx ADC 109 can generate a second digital signal $DS_2$ according to the operated analog signal CAS. The digital signal processing circuit 111 is used for processing the second digital signal $DS_2$ to generate a processed digital signal PDS. The extra DAC 113 is used for generating a feedback signal FB according to the processed digital signal PDS. It should be noted that the hybrid circuit 103 can be replaced with other interference restraining circuits. Also, the subtractor 105 can be replaced with other circuits according to requirements.

Figure 2:
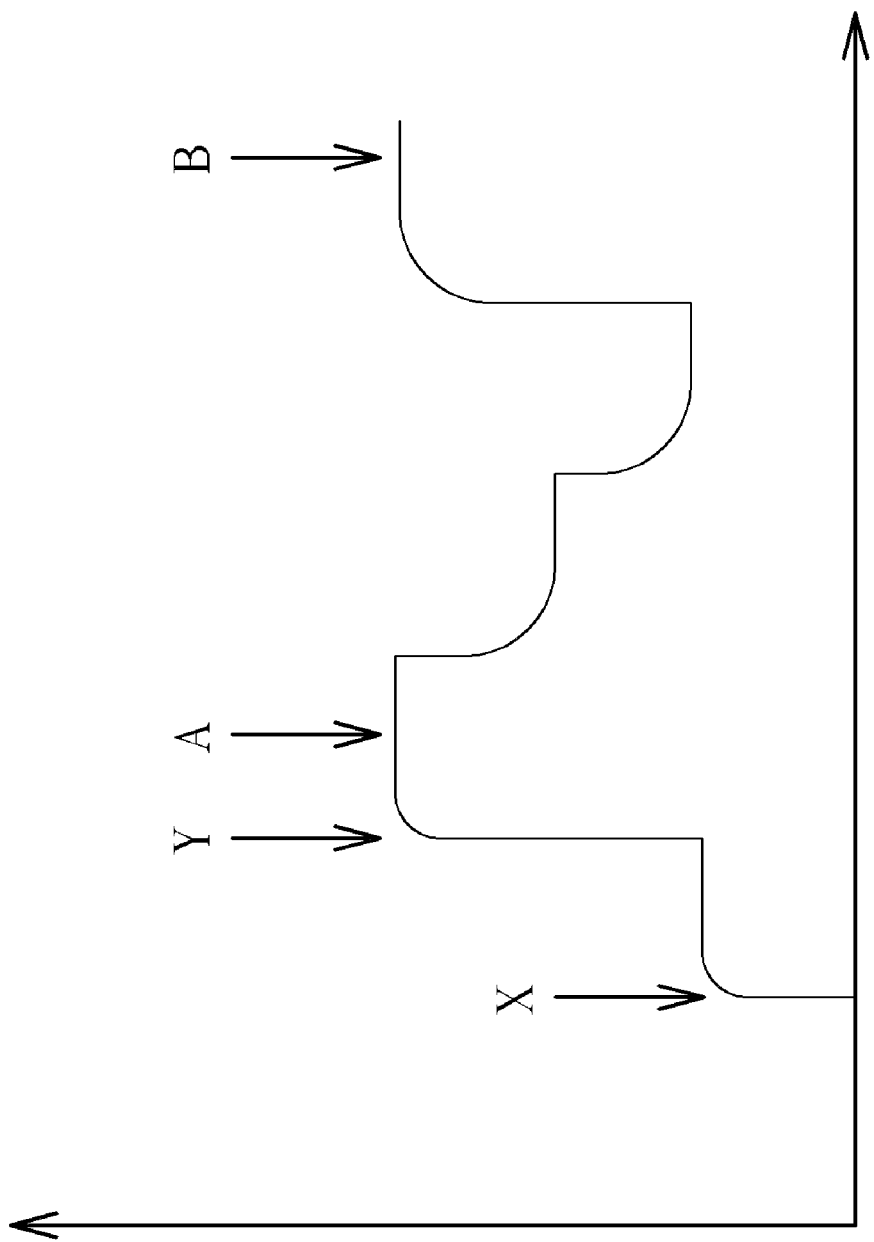
FIG. 2 is a timing diagram of signal transferring points of an interference signal.

The transceiver 100 can utilize an adjustable delay circuit 115 (for example, DLL) to delay a clock signal CLK according to a control signal $CS_1$ for respectively providing desired clock signals $DCLK_1$, $DCLK_2$ to at least one of the Tx ADC 101 and the extra DAC 113, such that a signal can be sampled accordingly. The control circuit 117 is used for generating the control signal $CS_1$ to the adjustable delay circuit 115 according to the processed digital signal PDS. If the transceiver 100 includes the hybrid circuit 103 or the analog front end circuit 107, and the hybrid circuit 103 or the analog front end circuit 107 include delay units, the control circuit 117 can generate control signals $CS_2$, $CS_3$ to control the delay amount of the analog front end circuit 107 or the delay amount of the hybrid circuit 103 according to the processed digital signal PDS. Via this mechanism, the sampling points of the Rx ADC 109 can avoid being located on signal transferring parts of the interference signal NS. Please refer to FIG. 2, which is a timing diagram of signal transferring points of an interference signal. As shown in FIG. 2, the points of X and Y are the transferring points. If the sampling point is located on the points of X and Y, effect of the interference signal NS becomes serious. Therefore, if the sampling point is located on points A and B illustrating in FIG. 2 instead of the points of X and Y, the interference signal NS has less effect on the last processed digital signal PDS.

Alternatively, the control circuit 117 can control the sampling points of the TX DAC 101, the extra DAC 113, or the delay amount of the hybrid circuit 103 and the analog front end circuit 107 according to the signal qualities such as SNR (Signal-to-Noise Ratio), BER (Bit Error Rate) of the processed digital signal PDS from the digital signal processing circuit 111. It should be noted that the control circuit 117 can be realized via hardware or software. For example, the control circuit 117 can be merged to the digital signal processing circuit 111, or the control circuit 117 can generate the control signal via an algorithm. Persons skilled in the art can utilize other methods or structures to reach the same function as the control circuit 117, which also falls within the scope of the present invention.

Figure 3:
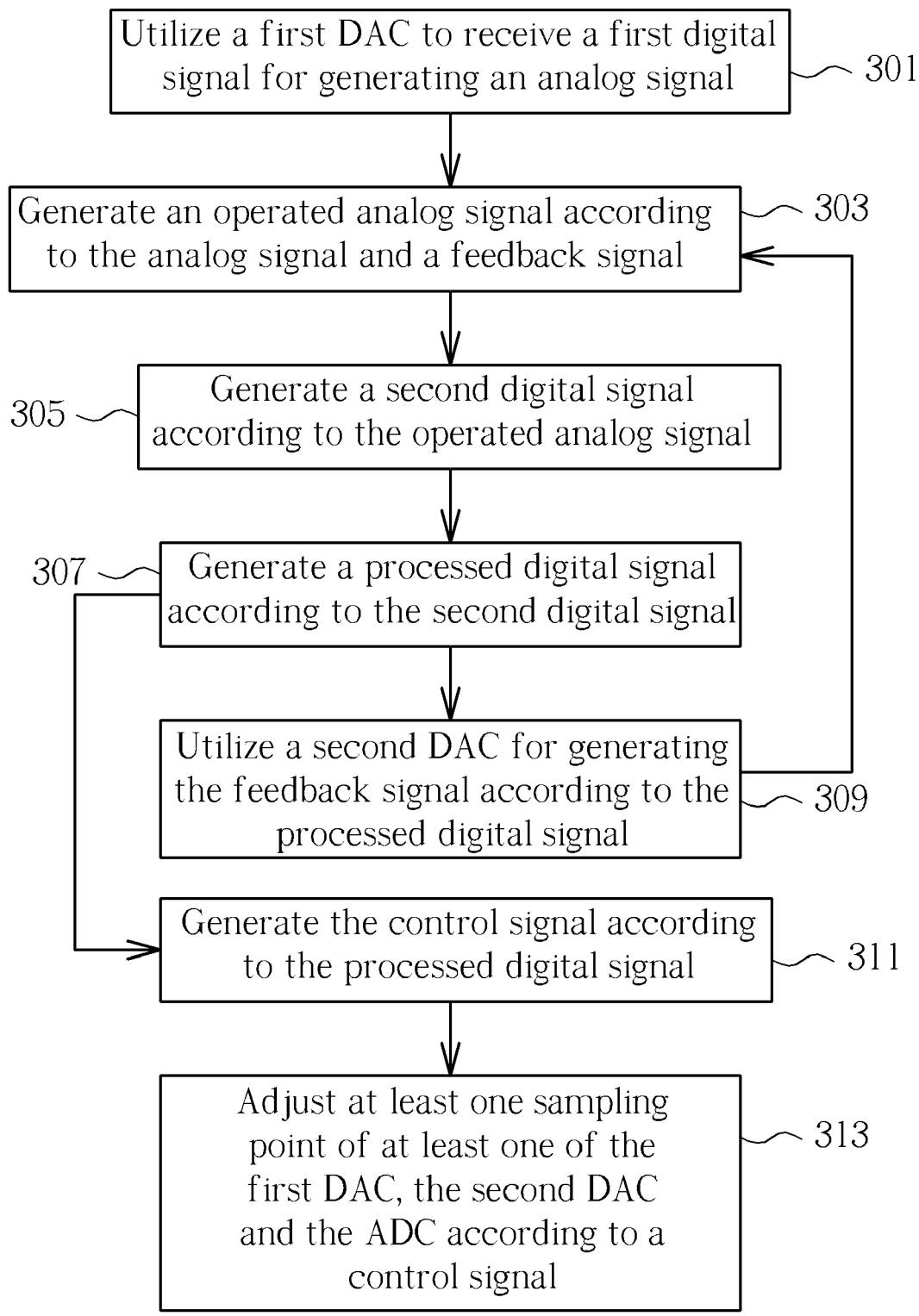
FIG. 3 is a flow chart illustrating a signal transmitting/receiving method corresponding to FIG. 1.

FIG. 3 is a flow chart illustrating a signal transmitting/receiving method corresponding to FIG. 1. Persons skilled in the art can easily understand a signal transmitting/receiving method according to the present invention according to the detailed characteristics shown in FIG. 1 and the concept shown in FIG. 3. Thus the description of the steps shown in FIG. 3 is omitted for brevity.

Figure 4:
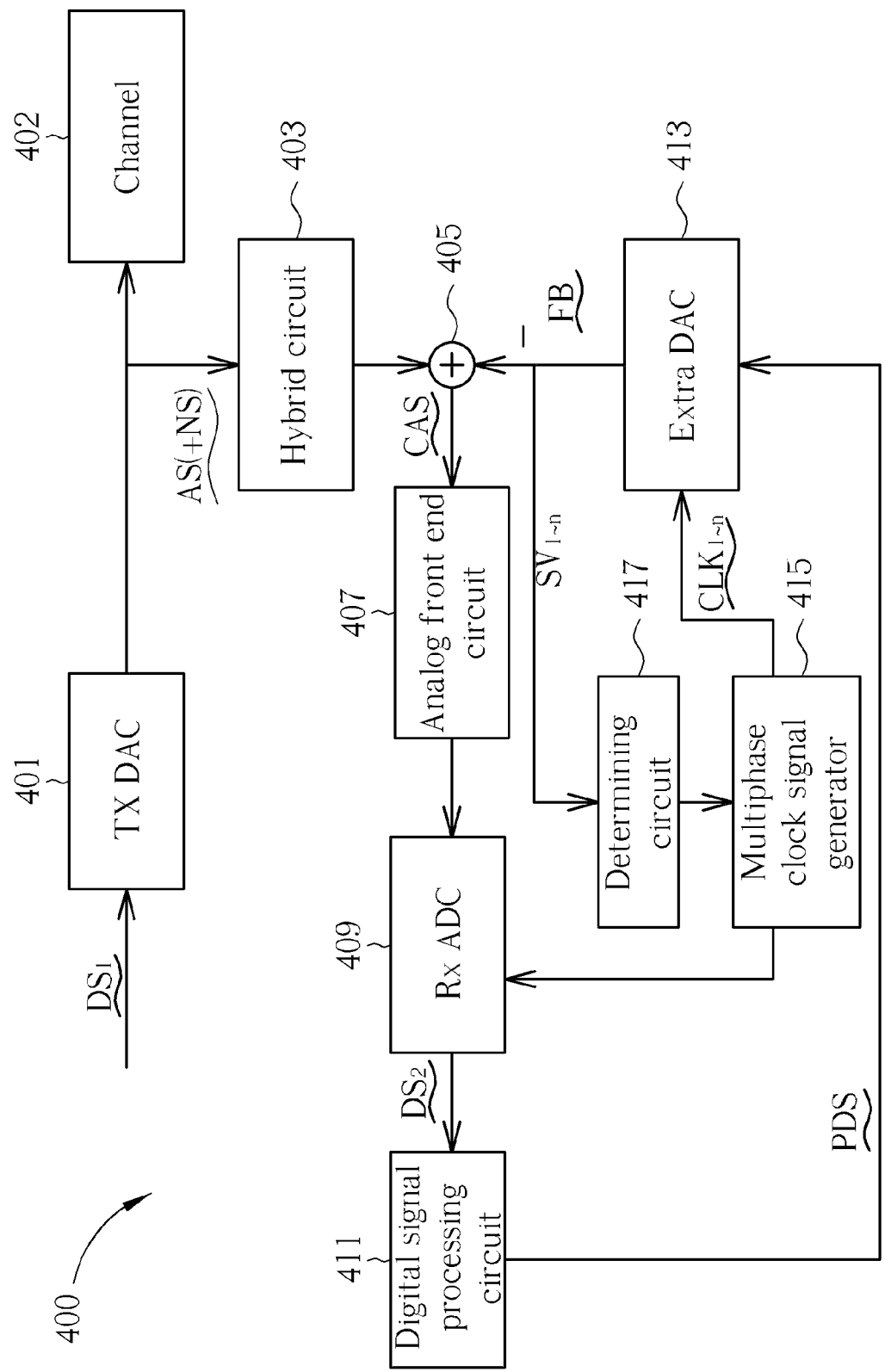
FIG. 4 is a functional block diagram of a transceiver according to a second embodiment of the present invention.

FIG. 4 is a functional block diagram of a transceiver according to a second embodiment of the present invention. As shown in FIG. 4, the transceiver 400 includes a Tx DAC 401, a hybrid circuit 403, a subtractor 405, an analog front end circuit 407, a Rx ADC 409, a digital signal processing circuit 411, an extra DAC 413, a multiphase clock signal generator 415 and a determining circuit 417. Similarly, the operations of the Tx DAC 401, the hybrid circuit 403, the subtractor 405, the analog front end circuit 407, a Rx ADC 409, a digital signal processing circuit 411, and the extra DAC 413 are the same as those in FIG. 1, and are thus omitted for brevity.

The multi phase clock signal generator 415 of the transceiver 400 can provide a plurality of clock signals $CLK_{1-n}$ with different phases to at least one of the Rx ADC 409 and the extra DAC 413. The determining circuit 417 is used for recording the sampling values $SV_{1-n}$, which are generated from the extra DAC 413 via sampling the processed digital signal PDS according to the clock signal $CLK_{1-n}$. Also, the determining circuit 417 can determine the clock signal $CLK_{1-n}$ according to the received sampling value $SV_{1-n}$. In one embodiment, the determining circuit 417 controls the multi phase clock signal generator 415 to generate the target clock signal. Furthermore, the determining circuit 417 can be merged to the digital processing circuit 411. That is, the digital processing circuit 411 can be utilized to record sampling values $SV_{1-n}$ and then determine the clock signal $CLK_{1-n}$ according to the sampling value $SV_{1-n}$.

As known by persons skilled in the art, the correctness of a sampling phase can be judged according to sampling values of a target device (the extra DAC 413 in this embodiment). If the sampling phase is a good one, the sampling value is a maximum, in theory. Accordingly, the determining circuit 417 can judge which sampling phase is preferable via the sampling values of the extra DAC 413, and the sampling phase is judged to be the best one if the sampling value is a maximum. Of course, persons skilled in the art can utilize other mechanisms to judge the best sampling phase, which also falls within the scope of the present invention. After the best sampling phase is determined, the Rx ADC of the transceiver can get correct signals to obtain correct 1,0 values, and the accuracy of the operation of omitting the analog signal AS to make the signal fall in the processing range of the Rx ADC increases accordingly.

Figure 5:
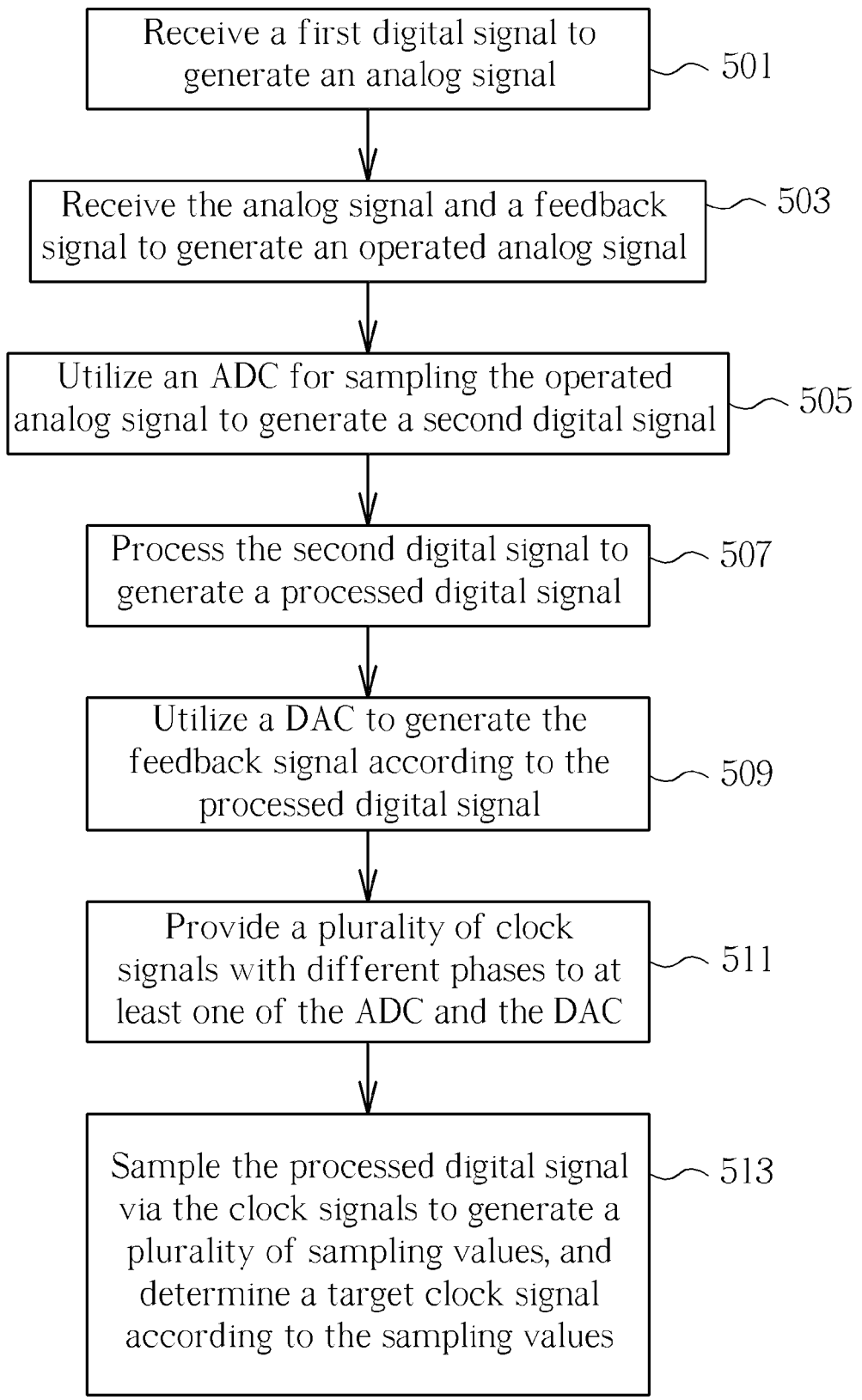
FIG. 5 is a flow chart illustrating a signal transmitting/receiving method corresponding to FIG. 4.

FIG. 5 is a flow chart illustrating a signal transmitting/receiving method corresponding to FIG. 4. Persons skilled in the art can easily understand a signal transmitting/receiving method according to the present invention and the detailed characteristics shown in FIG. 4 and the concept shown in FIG. 5. The description of the steps shown in FIG. 5 is therefore omitted for brevity.

According to the above-mentioned apparatus and method, the Rx ADC in the transceiver can sample a better location. Also, omission of part of the analog signal is more accurate when utilizing a subtractor. Additionally, the apparatus and method according to the present invention can be applied to other communication systems besides Ethernet.

Those skilled in the art will readily observe that numerous modifications and alterations of the device and method may be made while retaining the teachings of the invention.

What is claimed is:
1. A transceiver, comprising:
  a first digital to analog converter (DAC), for receiving a first digital signal to generate an analog signal;

an operation circuit, coupled to the first DAC, for receiving the analog signal and a feedback signal to generate an operated analog signal;

an analog to digital converter (ADC), for generating a second digital signal according to the operated analog signal;

a digital signal processing circuit, for processing the second digital signal to generate a processed digital signal;

a second DAC, for generating the feedback signal according to the processed digital signal;

an adjustable delay circuit, for delaying a clock signal according to a control signal to adjust at least one sampling point of at least one of the first DAC, the second DAC and the ADC;

a control circuit, for generating the control signal according to the processed digital signal; and an analog front end circuit, coupled between the ADC and the operating circuit, and comprising at least one delay circuit;

wherein the control circuit is further coupled to the analog front end circuit for controlling a delay amount of the analog front end circuit according to the processed digital signal.

2. The transceiver of claim 1, wherein the analog signal further includes an interference signal caused by the signal transmission channel, and the transceiver further comprises:

an interference restraining circuit, coupled to the first DAC and the operation circuit for restraining the interference signal, the interference restraining circuit including at least one delay unit;

wherein the control circuit is further coupled to the interference restraining circuit for controlling a delay amount of the interference restraining circuit according to the processed digital signal.

3. The transceiver of claim 1, wherein the analog signal further includes an interference signal caused by a transmission channel, where the control circuit controls the delay amount of the analog front end circuit such that a sampling point of the ADC can locate at a specific sampling point of the interference signal.

4. The transceiver of claim 3, wherein the specific sampling point locates at a part on which the interference signal does not undergo signal transference.

5. A transceiver, comprising:

a first digital to analog converter (DAC), for receiving a first digital signal to generate an analog signal;

an operation circuit, coupled to the first DAC, for receiving the analog signal and a feedback signal to generate an operated analog signal;

an analog to digital converter (ADC), for sampling the operated analog signal to generate a second digital signal;

a digital signal processing circuit, for processing the second digital signal to generate a processed digital signal;

a second DAC, for generating the feedback signal according to the processed digital signal;

a multi phase clock signal generator, for providing a plurality of clock signals with different phases to at least one of the ADC and the second DAC; and a determining circuit, for sampling the operated analog signal according to the clock signals to generate a plurality of sampling values, and for determining a sampling clock signal according to the sampling values.

6. The transceiver of claim 5, wherein the operation circuit is a subtractor for subtracting the feedback signal from the analog signal to generate the operated analog signal.

7. A signal receiving/transmitting method, adapted to a transceiver, the method comprising:

utilizing a first digital to analog converter (DAC) to receive a first digital signal for generating an analog signal;

generating an operated analog signal according to the analog signal and a feedback signal;

generating a second digital signal according to the operated analog signal;

generating a processed digital signal according to the second digital signal;

utilizing a second DAC for generating the feedback signal according to the processed digital signal;

generating the control signal according to the processed digital signal;

adjusting at least one sampling point of at least one of the first DAC and the second DAC according to the control signal;

controlling a delay amount of an interference restraining circuit of the transceiver according to the processed digital signal; and controlling a sampling point of the second DAC to locate at a specific sampling point of the interference signal according to the control signal.

8. The method of claim 7, further comprising:

controlling a delay amount of the analog front end circuit according to the processed digital signal.

9. The method of claim 7, wherein the specific sampling point locates at a part on which the interference signal does not undergo signal transference.

10. A signal receiving/transmitting method, utilizing in a transceiver, the method comprising:

receiving a first digital signal and a feedback signal;

generating an analog signal according to the first digital signal;

generating an operated analog signal according to the analog signal and the feedback signal;

utilizing an analog to digital converter (ADC) for sampling the operated analog signal to generate a second digital signal;

generating a processed digital signal according to the second digital signal;

utilizing a digital to analog converter (DAC) to generate the feedback signal according to the processed digital signal;

providing a plurality of clock signals with different phases to at least one of the ADC and the DAC; and sampling the processed digital signal according to the clock signals to generate a plurality of sampling values, and determining a target clock signal according to the sampling values.

11. The method of claim 10, further comprising:

determining one clock signal with a maximum value among the clock signals as the target clock signal.

12. A transceiver, comprising:

a first digital to analog converter (DAC), for receiving a first digital signal to generate an analog signal;

an operation circuit, coupled to the first DAC, for receiving the analog signal including an interference signal caused by the signal transmission channel and including a feedback signal to generate an operated analog signal;

an analog to digital converter (ADC), for generating a second digital signal according to the operated analog signal;

a digital signal processing circuit, for processing the second digital signal to generate a processed digital signal;
a second DAC, for generating the feedback signal according to the processed digital signal;
an adjustable delay circuit, for delaying a clock signal according to a control signal to adjust at least one sampling point of at least one of the first DAC, the second DAC and the ADC;
a control circuit, for generating the control signal according to the processed digital signal; and
an interference restraining circuit, coupled to the first DAC and the operation circuit for restraining the interference signal, the interference restraining circuit including at least one delay unit;
wherein the control circuit is further coupled to the interference restraining circuit for controlling a delay amount of the interference restraining circuit according to the processed digital signal.

* * * * *